Figure 1:
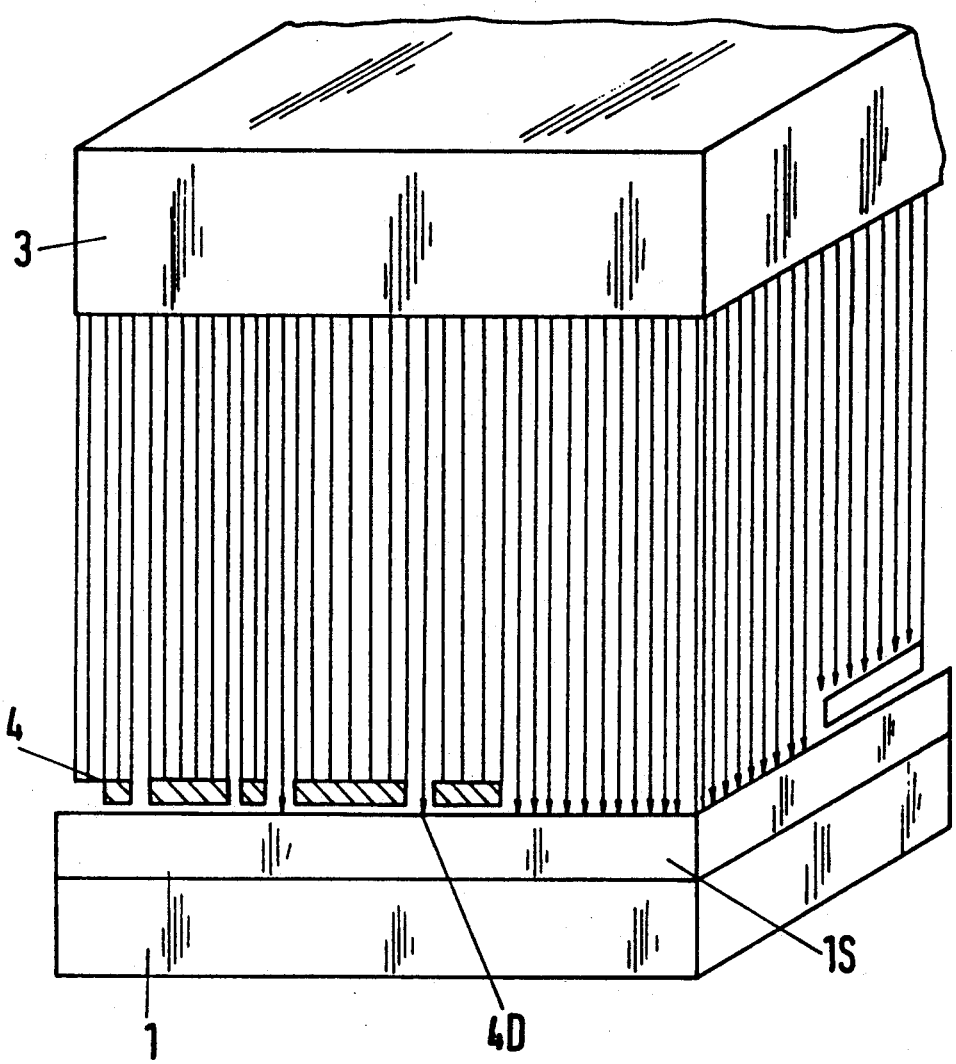

United States Patent [19]
Esrom et al.

[11] Patent Number: 5,207,955
[45] Date of Patent: May 4, 1993

[54] PROCESS FOR REMOVING AND/OR STRUCTURING SURFACES BY IRRADIATING WITH A LIGHT SOURCE

[75] Inventors: Hilmar Esrom, Edingen-Neckarhausen, Fed. Rep. of Germany; Ulrich Kogelschatz, Hausen b. Brugg, Switzerland

[73] Assignee: ABB Patent GmbH, Mannheim, Fed. Rep. of Germany

[21] Appl. No.: 815,262

[22] Filed: Dec. 27, 1991

[30] Foreign Application Priority Data

Dec. 27, 1990 [DE] Fed. Rep. of Germany ....... 4041884

[51] Int. Cl.⁵ .............................................. B44C 1/22
[52] U.S. Cl. .................................... 264/22; 156/643
[58] Field of Search .................. 264/22; 156/345, 643

[56] References Cited

U.S. PATENT DOCUMENTS

| 4,249,143 | 2/1981 | Eden | 372/55 |
| 4,508,749 | 4/1985 | Brannon et al. | 156/643 |
| 4,857,382 | 8/1989 | Liu et al. | 156/646 |

*Primary Examiner*—Jill L. Heitbrink
*Attorney, Agent, or Firm*—Herbert L. Lerner; Laurence A. Greenberg

[57] ABSTRACT

The process removes or partially structures the surface of a substrate of a polymer, i.e. polyamide, polyimide and polycarbonate. The surface of the substrate is irradiated in a vacuum with an incoherent UV radiation which has a wavelength of 60 nm to 400 nm, preferably a wavelength of 172 nm. In order to form the structures, a mask is placed on the surface of the substrate.

3 Claims, 1 Drawing Sheet

PROCESS FOR REMOVING AND/OR STRUCTURING SURFACES BY IRRADIATING WITH A LIGHT SOURCE

The invention relates to a process for structuring surfaces of substrates of polymers by means of a light source.

Organic polymers are of great significance for a number of applications in the fields of electronics, printed circuit-board, multilayer and semiconductor technology and in optoelectronics. The polymers which are of particular significance for such techniques have an excellent chemical stability. Substrates of those polymers which have to be provided with a structuring on their surfaces for application in such technology, can only be given the required surface treatment with considerable effort.

U.S. Pat. No. 4,857,382 describes a process and an apparatus for the photochemical etching of polymers in the form of polyimides, polyamides and polycarbonates. A light source in the form of a mercury lamp, which continuously emits UV light, is used for that purpose. Less than 10% of the UV radiation has a wavelength of less than 200 nm. As a result, only a very low material removal rate is possible. Complex geometric structures cannot be formed on the surface by means of such a light source. Since a considerable proportion of the radiation lies in the infrared range, an additional cooling of the device and of the substrate is necessary, which in turn makes the apparatus and the process more difficult and more expensive.

It is accordingly an object of the invention to provide a process for treating surfaces, which overcomes the hereinafore-mentioned disadvantages of the heretofore-known methods of this general type and which permits the structuring of surfaces of substrates of polymers to be carried out more easily and more cost-effectively.

With the foregoing and other objects in view there is provided, in accordance with the invention, in a process for removing and/or structuring surfaces of substrates of polymers by irradiating with a light source, the improvement which comprises partly or completely exposing the surface of the substrate to the effect of UV photons at a wavelength of substantially between 60 nm and 400 nm.

According to the invention, the surface of a substrate of a polymer which is intended to be completely or partially removed is irradiated with light which preferably has a wavelength of between 60 and 340 nm. In the structuring of surfaces of substrates which are made from polyimide or polycarbonate, a UV radiation at a wavelength of 172 nm is preferably used. A high-power UV lamp, which is also referred to below as an excimer lamp for short, is used as the radiation source. With this lamp, the entire substrate surface can be irradiated. According to the invention, instead of one lamp it is also possible to use more than one lamp. By increasing the UV output of the excimer lamps, the removal rate can be increased considerably.

In accordance with another mode of the invention, there is provided a process which comprises irradiating the surface of the substrate with a high-power lamp generating UV radiation at a wavelength of substantially between 60 nm and 400 nm, for completely removing or partially structuring the surface of the substrate.

In accordance with a further mode of the invention, there is provided a process which comprises at least partially exposing the surface of the substrate of a material selected from the group consisting of polyimide, polyamide and polycarbonate to the effect of UV photons at a wavelength of substantially 172 nm.

In accordance with an added mode of the invention, there is provided a process which comprises irradiating the surface of the substrate of a material selected from the group consisting of polyimide, polyamide and polycarbonate with UV radiation having a wavelength of substantially 172 nm being generated by a high-power lamp with a xenon gas filling, for removing or partially structuring the surface of the substrate.

In accordance with a concomitant mode of the invention, there is provided a process which comprises irradiating the surface of the substrate selected from the group consisting of of polyimide, polyamide and polycarbonate with UV radiation of a wavelength of substantially 172 nm for substantially 1 to 30 minutes in a vacuum, for completely removing or structuring the surface of the substrate.

Other features which are considered as characteristic for the invention are set forth in the appended claims.

Although the invention is illustrated and described herein as embodied in a process for treating surfaces, it is nevertheless not intended to be limited to the details shown, since various modifications may be made therein without departing from the spirit of the invention and within the scope and range of equivalents of the claims.

The method of operation of the invention, however, together with additional objects and advantages thereof will be best understood from the following description of specific embodiments when read in connection with the accompanying drawings.

Figure 2:
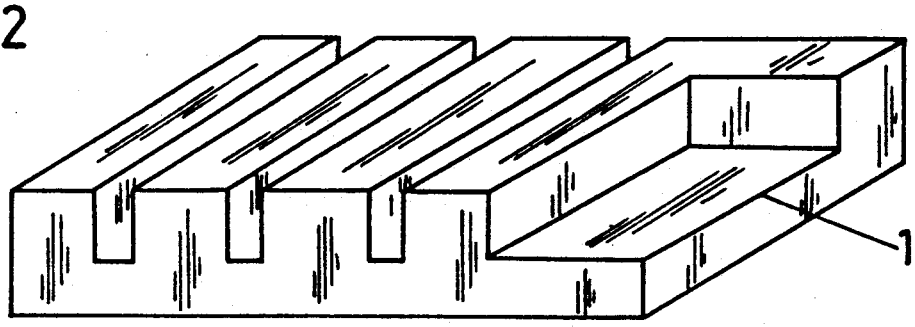

FIG. 1 is fragmentary, diagrammatic, perspective view showing treatment of a substrate surface; and FIG. 2 is a perspective view showing the substrate produced by the treatment according to FIG. 1.

Referring now to the figures of the drawing in detail and first, particularly, to FIG. 1 thereof, there is seen a sheet-like substrate 1, having a rectangular cross-section and being made of a polymer. It is assumed that the polymer is a polyimide. Substrates of polycarbonate can likewise be treated in this way. An excimer lamp or radiator 3 is disposed at a defined distance from a surface 1S of the substrate 1. The lamp is only represented diagrammatically in FIG. 1. A detailed description of such an excimer lamp 3 can be taken from Published European Application No. 0,254,111. The excimer lamp 3 includes a non-illustrated discharge space bounded by a non-illustrated metal electrode, which is cooled on one side, and a dielectric, or by two non-illustrated dielectrics, and it is filled with an inert gas or gas mixture. The dielectric and another electrode, which lies on a surface of the dielectric facing away from the discharge space, are transparent to the radiation generated by silent electric discharge. Through the use of this construction and by a suitable choice of a gas filling, the high-power UV lamp 3 with a large surface area and high efficiency is created. With the aid of the respective gas filling, UV radiation at a wavelength range of between 60 and 400 nm can be generated. The most important feature of this type of discharge is the existence of a dielectric barrier, that is to say an insulator in the flow path between the electrodes. Since this insulator does not allow direct current to pass through, the discharge can be performed only with alternating current. The dielectric displacement current thereby feeds the discharge or, put another way, the dielectric brings about a capacitive coupling between the driving electric source and the discharge plasma. If the silent discharge is performed at a pressure above about 0.1 bar, very many thin current filaments form. These microdischarges in each case are formed of an approximately cylindrical plasma column and merge at the transition to the dielectric into a surface discharge.

The UV radiation is generated by excimer formation in the microdischarges.

If it is intended, for example, to provide the substrate 1, that is produced from polyimide, with a surface structure, a mask 4 is placed on the surface of the substrate 1, as shown in FIG. 1. This mask is provided with openings 4D. The light coming from the excimer lamp 3 can pass through these openings 4D onto the surface of the substrate 1. It has been found that etching away of the polymer is possible by using radiation at a wavelength of 172 nm. In order to be able to generate such UV radiation with the aid of the high-power lamp 3, the lamp is given a gas filling of xenon. By electron collision, the xenon discharge leads to the formation of excited xenon atoms Xe* and subsequently to excimer formation.

In the discharge, additional reactions take place between further excited co-reactants Xe, $Xe_2$ as well as positive ions $Xe^+$, $Xe_2^+$ and electrons. The $Xe_2$* excimers that are formed decay within a few nanoseconds and give off their bonding energy in the form of UV radiation. The high-power lamp 3 is fed with an alternating voltage, having a frequency which lies between 50 Hz and 1 MHz, and an amplitude which is a few kilovolts. Through the use of a suitable choice of the filling pressure and the discharging parameters, a spectrum in which only the second continuum of the $Xe_2$* excimer appears is produced. This is a relatively narrow-band emission, having a maximum which lies at 172 nm in vacuum ultraviolet and a half-width which is about 12 nm. This radiation corresponds to a photon energy of 7.2 eV and is consequently capable in terms of energy of splitting various chemical molecular compounds directly. Among these molecular compounds are also those of polyimide, from which the substrate 1 is produced. The photon fluxes which can be achieved with the high-power lamp lie at $10^{16}$ to $10^{17}$ photons per second and per $cm^2$ of electrode surface area (order of magnitude: 100 mW/$cm^2$). Very high UV outputs can be achieved by enlarging the electrode surface area or by the parallel connection of a plurality of such high-power lamps. The surface 1S of the substrate 1 that is represented in FIG. 1 is then irradiated through the mask 4 by means of such a high-power lamp 3 which emits UV radiation at a wavelength of 172 nm. After an exposure time of 30 minutes, with the entire configuration being disposed in a vacuum, the substrate 1 represented in FIG. 2 with the surface structuring as shown is produced. In the region of the openings 4D, the surface layer 1S is etched away down to a depth of 1.5 μm. The surface areas protected by the mask 4 are not etched away. According to the invention, it is also possible with the aid of the high-power lamp 3 to remove 1.5 μm off the entire surface 1S of the substrate 1. For this purpose, the use of the mask 4 is dispensed with completely, so that a full-area irradiation is possible. In the same way, substrates 1 of polycarbonate can be provided with a structured surface 1S.

We claim:

1. In a process for removing and/or structuring surfaces by irradiating with a light source, the improvement which comprises producing incoherent UV radiation having a wavelength of substantially 172 nm with a high-power lamp filled with xenon gas filling, irradiating a polyamide surface for 1 to 30 minutes in a vacuum with the incoherent UV radiation, and removing and/or structuring the polyamide surface to substantially 1.5 μm.

2. In a process for removing and/or structuring surfaces by irradiating with a light source, the improvement which comprises producing incoherent UV radiation having a wavelength of substantially 172 nm with a high-power lamp filled with a xenon gas filling, irradiating a polyimide surface for 1 to 30 minutes in a vacuum with the incoherent UV radiation, and removing and/or structuring the polyimide surface to substantially 1.5 μm.

3. In a process for removing and/or structuring surfaces by irradiating with a light source, the improvement which comprises producing incoherent UV radiation having a wavelength of substantially 172 nm with a high-power lamp filled with a xenon gas filling, irradiating a polycarbonate surface for 1 to 30 minutes in a vacuum with the incoherent UV radiation, and removing and/or structuring the polycarbonate surface to substantially 1.5 μm.

* * * * *